United States Patent
Disegni et al.

(10) Patent No.: US 9,830,995 B2
(45) Date of Patent: Nov. 28, 2017

(54) CIRCUIT AND METHOD FOR BIASING NONVOLATILE MEMORY CELLS

(71) Applicant: STMicroelectronics S.r.l., Agrate Brianza (IT)

(72) Inventors: Fabio Enrico Carlo Disegni, Spino D'adda (IT); Giuseppe Castagna, Palermo (IT); Maurizio Francesco Perroni, Furnari (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 15/140,796

(22) Filed: Apr. 28, 2016

(65) Prior Publication Data

US 2017/0062064 A1 Mar. 2, 2017

(30) Foreign Application Priority Data

Aug. 25, 2015 (IT) .................. 102015000046341

(51) Int. Cl.
| | |
|---|---|
| *G11C 16/28* | (2006.01) |
| *G05F 3/24* | (2006.01) |
| *G11C 5/14* | (2006.01) |
| *G11C 7/12* | (2006.01) |
| *G11C 7/14* | (2006.01) |
| *G11C 16/24* | (2006.01) |
| *G11C 16/30* | (2006.01) |
| *G11C 16/08* | (2006.01) |
| *G11C 16/10* | (2006.01) |
| *G11C 16/14* | (2006.01) |
| *G11C 7/04* | (2006.01) |
| *G11C 8/10* | (2006.01) |

(52) U.S. Cl.
CPC .............. *G11C 16/28* (2013.01); *G05F 3/245* (2013.01); *G11C 5/147* (2013.01); *G11C 7/12* (2013.01); *G11C 7/14* (2013.01); *G11C 16/08* (2013.01); *G11C 16/10* (2013.01); *G11C 16/14* (2013.01); *G11C 16/24* (2013.01); *G11C 16/30* (2013.01); *G11C 7/04* (2013.01); *G11C 8/10* (2013.01)

(58) Field of Classification Search
CPC ............................... G11C 16/28; G11C 16/08
USPC ..................................................... 365/185.2
See application file for complete search history.

(56) References Cited

U.S. PATENT DOCUMENTS

| | | | |
|---|---|---|---|
| 5,929,621 A | 7/1999 | Angelici et al. | |
| 6,134,141 A * | 10/2000 | Wong .................. | G11C 7/1039 365/185.03 |
| 6,184,670 B1 | 2/2001 | Mulatti et al. | |
| 2004/0151023 A1* | 8/2004 | Khouri .................... | G11C 7/04 365/163 |
| 2005/0180188 A1 | 8/2005 | Bedeschi et al. | |
| 2006/0044882 A1* | 3/2006 | Nahas .................... | G11C 5/147 365/189.09 |

(Continued)

*Primary Examiner* — Hoai V Ho
*Assistant Examiner* — Muna A Techane
(74) *Attorney, Agent, or Firm* — Slater Matsil, LLP

(57) ABSTRACT

A circuit for biasing non-volatile memory cells includes a dummy decoding path between a global bias line and a biasing node, a reference current generator coupled to the dummy decoding path and configured to supply a reference current, a biasing stage configured to set a cell bias voltage on the biasing node, and a compensation stage configured to compensate a current absorption of the biasing stage at the biasing node so that the reference current will flow through the dummy decoding path.

20 Claims, 4 Drawing Sheets

(56) References Cited

U.S. PATENT DOCUMENTS

| | | | |
|---|---|---|---|
| 2008/0298122 A1* | 12/2008 | Bedeschi | G11C 13/0004 365/163 |
| 2012/0218837 A1 | 8/2012 | Dimartino et al. | |
| 2013/0148405 A1 | 6/2013 | Kang et al. | |
| 2013/0321068 A1 | 12/2013 | Castagna et al. | |
| 2015/0092470 A1* | 4/2015 | Vimercati | G11C 13/004 365/148 |
| 2016/0119517 A1* | 4/2016 | Topliss | H04N 5/2253 348/374 |

\* cited by examiner

CIRCUIT AND METHOD FOR BIASING NONVOLATILE MEMORY CELLS

This application claims priority to Italian Patent Application No. 102015000046341, filed on Aug. 25, 2015, which application is hereby incorporated herein by reference.

TECHNICAL FIELD

The present invention relates to a circuit and a method for biasing non-volatile memory cells.

BACKGROUND

As is known, in program and read operations of non-volatile memory cells a delicate aspect regards proper biasing of the drain terminals of the cells selected. The problem of biasing is generally felt, but regards in particular non-volatile memories of an electrical type, such as flash memories, which are, further, the most widespread. On one hand, in fact, cells that are not properly biased are subjected to stresses, which, over time and with repetition of program/erase/read cycles, may cause deterioration, especially of the gate-oxide regions. On the other hand, the outcome of the operations may be affected by inadequate biasing of the drain terminals. For program and erase operations the problem of stability of the biasing quantities is evidently more significant since an error during program/erase step causes systematic errors in the read step.

Known bias circuits have some limitations, which at times do not enable satisfactory performance to be achieved as regards the biasing quantities. For instance, the drain voltage also depends upon the current that flows through the cells during the program step (in general, this current initially has a high value that decreases as the threshold of the cells selected for programming increases). In the program circuits, a reference current independent of temperature simulates the cell current in the program step. Other current contributions, which are, instead, not immune to temperature variations and are significantly affected by process spread may, however, add to the reference current. The non-stable current contributions do not allow to copy the conditions present in the memory array with sufficient accuracy. Biasing may thus prove inadequate.

SUMMARY

Embodiments of the present invention provide a circuit and a method for biasing non-volatile memory cells that will enable the limitations described to be overcome or at least mitigated.

One embodiment discloses a bias circuit for biasing non-volatile memory cells. The bias circuit includes a dummy decoding path between a global bias line and a bias node. A reference current generator is coupled to the dummy decoding path and is configured to supply a reference current. A bias stage is configured to set a cell bias voltage on the bias node. A compensation stage is configured to compensate a current absorption of the bias stage at the bias node so that the reference current will flow through the dummy decoding path.

Another embodiment discloses a method for biasing non-volatile memory cells. A reference current is supplied through a dummy decoding path between a global bias line and a bias node, including compensating a current absorption of the bias stage at the bias node. A cell bias voltage is set on the bias node by a bias stage.

BRIEF DESCRIPTION OF THE DRAWINGS

For a better understanding of the invention, some embodiments thereof will now be described, purely by way of non-limiting example and with reference to the attached drawings, wherein.

DETAILED DESCRIPTION OF ILLUSTRATIVE EMBODIMENTS

Figure 1:
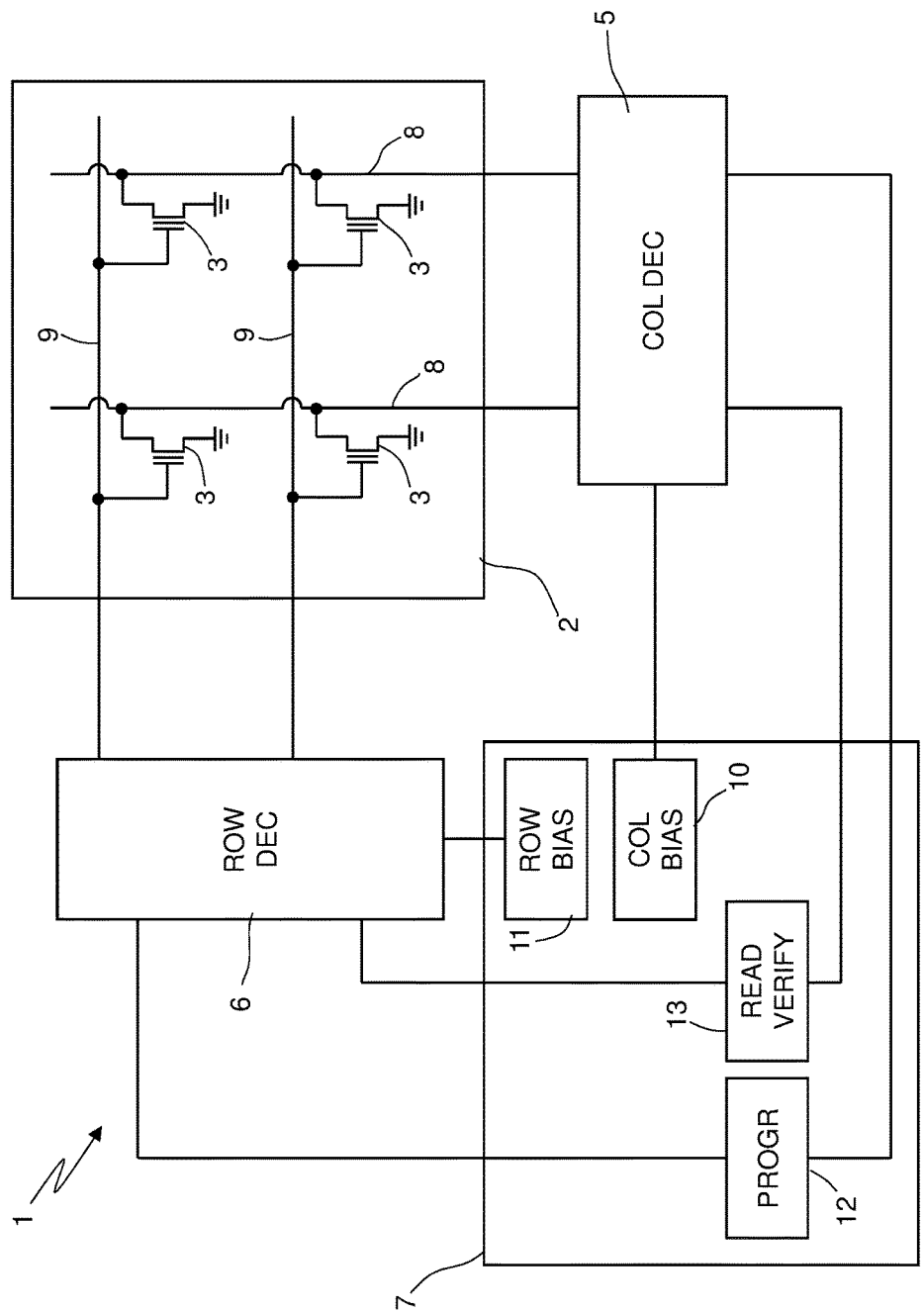
FIG. 1 is a simplified block diagram of a non-volatile memory device.

In FIG. 1, a non-volatile memory device, for example of a flash type, is designated as a whole by the reference number 1. The device 1 comprises a memory array 2, formed by a plurality of memory cells 3 arranged in rows and columns, a column decoder 5, a row decoder 6, and a program and read circuit 7. The memory cells 3 have N storage levels and are thus able to store a number of bits B equal to $\log_2 N$ (for example, N=4, B=2; with N=2 and B=1 conventional two-level cells are obtained). Furthermore, memory cells 3 arranged along a same column are connected to a same bitline 8 and memory cells 3 arranged along a same row are connected by a same wordline 9. The column decoder 5 and row decoder 6, both of a known type, are configured to connect selectively a bitline 8 (or a set of bitlines 8) and a wordline 9, respectively, which are addressed for program and read operations by the program and read circuit 7.

The program and read circuit 7 comprises a column bias circuit 10, a row bias circuit 11, a program circuit 12, and a read/verify circuit 13. The column bias circuit 10 and the row bias circuit 11 are coupled, respectively, to the bitlines 8 and the wordlines 9 each time selected through the column decoder 5 and the row decoder 6.

Figure 2:
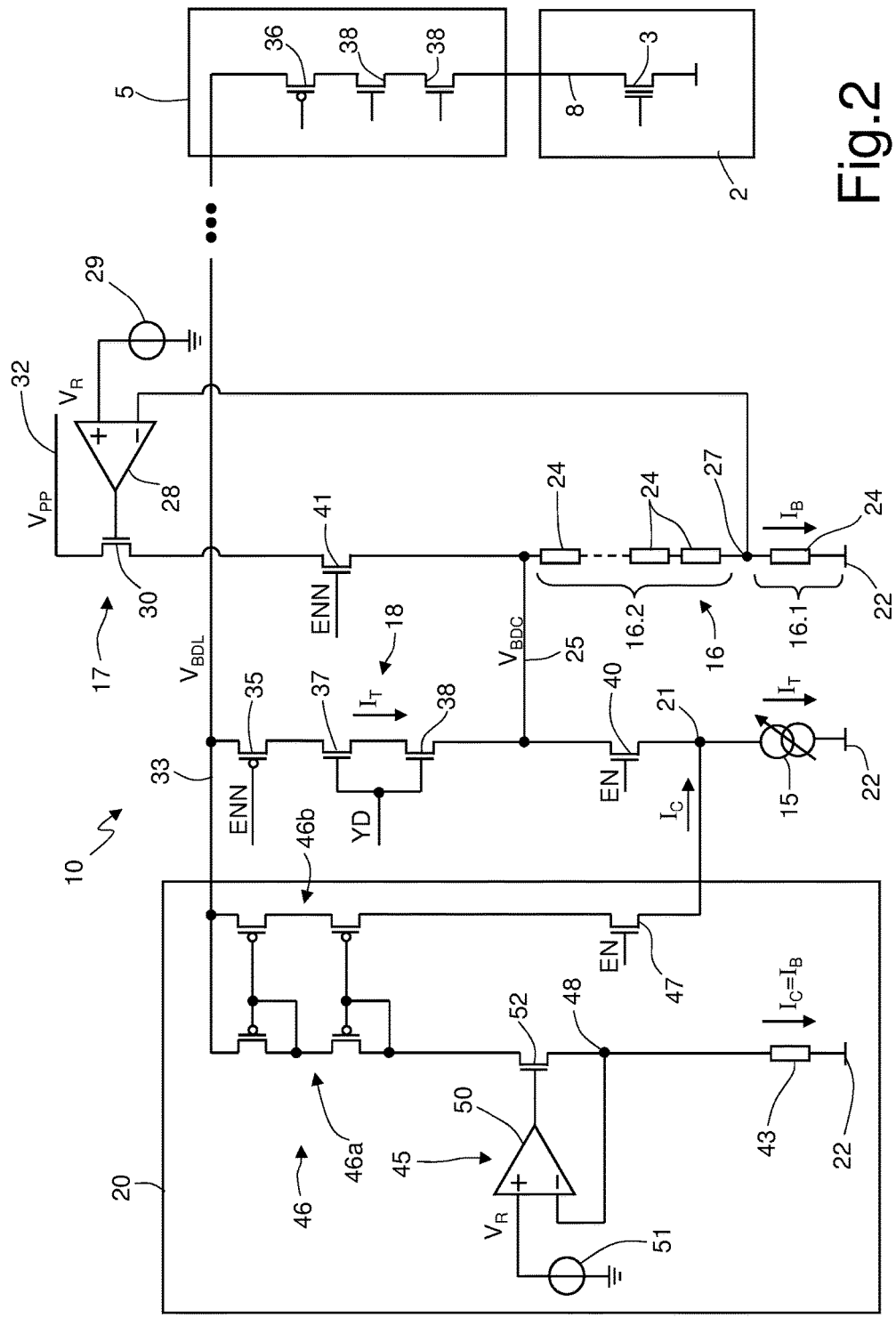
FIG. 2 is a simplified circuit diagram of a circuit for biasing non-volatile memory cells according to one embodiment of the present invention, incorporated in the non-volatile memory device of FIG. 1.

The bias circuit 10, an example of which is illustrated in greater detail in FIG. 2, comprises a reference current generator 15, a bias resistive divider 16, a voltage regulator 17, a dummy decoding path 18, and a compensation stage 20. FIG. 2 further shows a memory cell 3 selected and connected to the bias circuit 10 through a respective bitline 8 and the column decoder 5.

The reference current generator 15 has a terminal coupled to one current adder node 21 and one terminal coupled to a ground line 22. The reference current generator 15 is programmable and supplies a reference current $I_T$ that reproduces the average current flowing in the memory cell 3 during programming. In one embodiment, the reference current $I_T$ may be decremented in steps, for example of 15 μA.

The bias resistive divider 16 comprises a plurality of resistive modules 24 between a cell bias node 25 and the ground line 22. In one embodiment, the resistive modules 24 are the same as one another. In detail, a first set of resistive modules 24 (just one module 24 in the example of FIG. 2) is connected between a bias regulation node 27 and the ground line 22 and defines a first portion 16.1 of the divider 16, and a second set of resistive modules 24 is connected between the cell bias node 25 and the bias regulation node 27 and defines a second portion 16.2 of the divider 16.

The voltage regulator 17 is configured to impose a reference voltage $V_R$ on the bias regulation node 27. In one embodiment, the voltage regulator 17 comprises an operational amplifier 28, a reference voltage generator 29, and a limiting transistor 30. The operational amplifier 28 has an input terminal, for example a inverting terminal, coupled to the bias regulation node 27, an input terminal, for example a non-inverting terminal, coupled to the reference voltage generator 29 for receiving the reference voltage $V_R$, and an output coupled to a control terminal of the limiting transistor 30. The reference voltage generator 29 is configured so that the reference voltage $V_R$ is independent of the temperature. In one embodiment, the reference voltage generator 29 is a band-gap generator. The limiting transistor 30 has conduction terminals, one of which is connected to a boosted line 32, which receives a boosted voltage $V_{PP}$ from a voltage booster stage (not illustrated), and the other to a global bias line 33. The limiting transistor 30 operates on the bias regulation node 27 through the dummy decoding path 18 and the second portion 16.2 of the divider 16.

As a result of the action of the voltage regulator 17, a bias current $I_B$ flows through the bias resistive divider 16 and is given by the ratio between the reference voltage $V_R$ and the resistance of the first portion 16.1 of the bias resistive divider 16 (in this case, of a resistive module 24). Furthermore, the cell bias node 25 is set to a cell bias voltage $V_{BDC}$, determined by the overall resistance of the bias resistive divider 16 and by the bias current $I_B$ imposed by the voltage regulator 17. In one embodiment, in which K equal resistive modules are present, the cell bias voltage $V_{BDC}$ is $KV_R$.

The dummy decoding path 18 is connected between the global bias line 33 and the cell bias node 25 and replicates the conductive path presented by the column decoder 5. In particular, the dummy decoding path 18 comprises a dummy enable transistor 35, which replicates an enable transistor 36 of the column decoder 5, and a series of dummy decoding transistors 37, that are equal in number to, and the same in structure as, the decoding transistors 38 of the column decoder 5. The dummy decoding transistors 37 are kept in conduction by a dummy decoding signal YD during the program and erase operations. Passage of current through the dummy decoding path 18 causes a voltage drop and sets the global bias line 33 to a line bias voltage $V_{BDL}$.

The cell bias node 25 and the current adder node 21 are selectively connectable through an enable transistor 40. Likewise, the global bias line 33 and the cell bias node 25 are selectively connectable through an enable transistor 41, which is controlled in a complementary way with respect to the enable transistor 40. In one embodiment, the enable transistor 40 and the enable transistor 41 are both of an NMOS type; the former receives, however, a direct enable signal EN, whereas the latter receives a negated enable signal ENN. The dummy enable transistor 35 and the enable transistor 40 are, instead, driven to be both in conduction or both in cut-off. In one embodiment, in particular, the dummy transistor 35 is of a PMOS type and receives the negated enable signal ENN.

The compensation stage 20 is configured to inject into the current adder node 21 a compensation current $I_C$ equal, and of opposite sign with respect, to the bias current $I_B$ that flows through the bias resistive divider 16.

In detail, the compensation stage 20 comprises a resistive element 43, a voltage regulator 45, a current mirror 46, and an enable transistor 47.

The resistive element 43 is connected between a compensation regulation node 48 and the ground line 22 and has the same impedance as the first portion 16.1 of the divider 16.

The voltage regulator 45 is configured to impose the reference voltage $V_R$ on the compensation regulation node 48 and comprises an operational amplifier 50, a reference voltage generator 51, and a limiting transistor 52. The operational amplifier 50 has an input terminal, for example an inverting one, coupled to the compensation regulation node 48, an input terminal, for example a non-inverting one, coupled to the reference voltage generator 51, and an output coupled to a control terminal of the limiting transistor 52. The reference voltage generator 51 supplies the same reference voltage $V_R$ as that supplied by the reference voltage generator 29 and also this is independent of the temperature; for example, it is of a band-gap type. The conduction terminals of the limiting transistor 52 are connected one to the compensation regulation node 48 and the other to a reference branch 46a of the current mirror 46.

Since the voltage regulator 45 imposes on the compensation regulation node 48 the same reference voltage $V_R$ as the one that is present on the bias regulation node 27 and the impedance of the resistive element 43 is equal to the impedance of the first portion 16.1 of the divider 16, the compensation current $I_C$ that flows through the limiting transistor 52 and the resistive element 43 is equal in absolute value to the bias current $I_B$.

An output branch 46b of the current mirror 46, which is for example in cascode configuration, replicates the compensation current $I_C$, which is injected into the current adder node 21 through the enable transistor 47. The enable transistor 47 is identical to the enable transistor 40 and is driven by the same direct enable signal EN.

The bias circuit 10 operates as described in what follows. When the bias circuit 10 is activated by the direct enable signal EN and the negated enable signal ENN, the enable transistors 35, 40, 47 are in conduction, whereas the enable transistor 41 is cut-off. The voltage regulator 17 sets the bias regulation node 27 to the reference voltage $V_R$, thus causing the bias current $I_B$ to flow, which brings the cell bias node 25 to the cell bias voltage $V_{BDC}$. At the same time, the compensation stage 20 supplies the compensation current $I_C$ to the current adder node 21. As already mentioned, the compensation current $I_C$ is generated starting from a voltage reference and a resistive element identical to the ones used for generating the bias current $I_B$. The two currents are thus equal. For this reason, the balance of currents at the nodes 21 and 25, which in use are directly connected to one another, shows that the compensation current $I_C$ balances the bias current $I_B$ exactly.

Consequently, the current in the dummy decoding path 18 is equal to the reference current $I_T$, which reproduces the average current flowing in the memory cell 3 during programming. In the absence of the compensation stage 20, instead, the bias current $I_B$ would be added to the reference current $I_T$ and would affect the potential drop on the dummy decoding path 18, i.e., the potential difference $V_{BDL}-V_{BDC}$. Given that the bias current $I_B$ may be affected by temperature variations, in addition to process spread, also the potential difference $V_{BDL}-V_{BDC}$ would be affected by unpredictable elements of variability. It would hence not be possible to reproduce in a stable way the bias conditions of the memory cells 3 selected for programming, in particular as regards the potential difference between the global bias line 33 and the drain terminal of the selected cells 3.

Use of the compensation stage 20, instead, allows the elimination of the dependence of the current in the dummy decoding path 18 upon the bias current $I_B$, thus reducing dependence upon the temperature and upon the process spread in the components.

Figure 3:
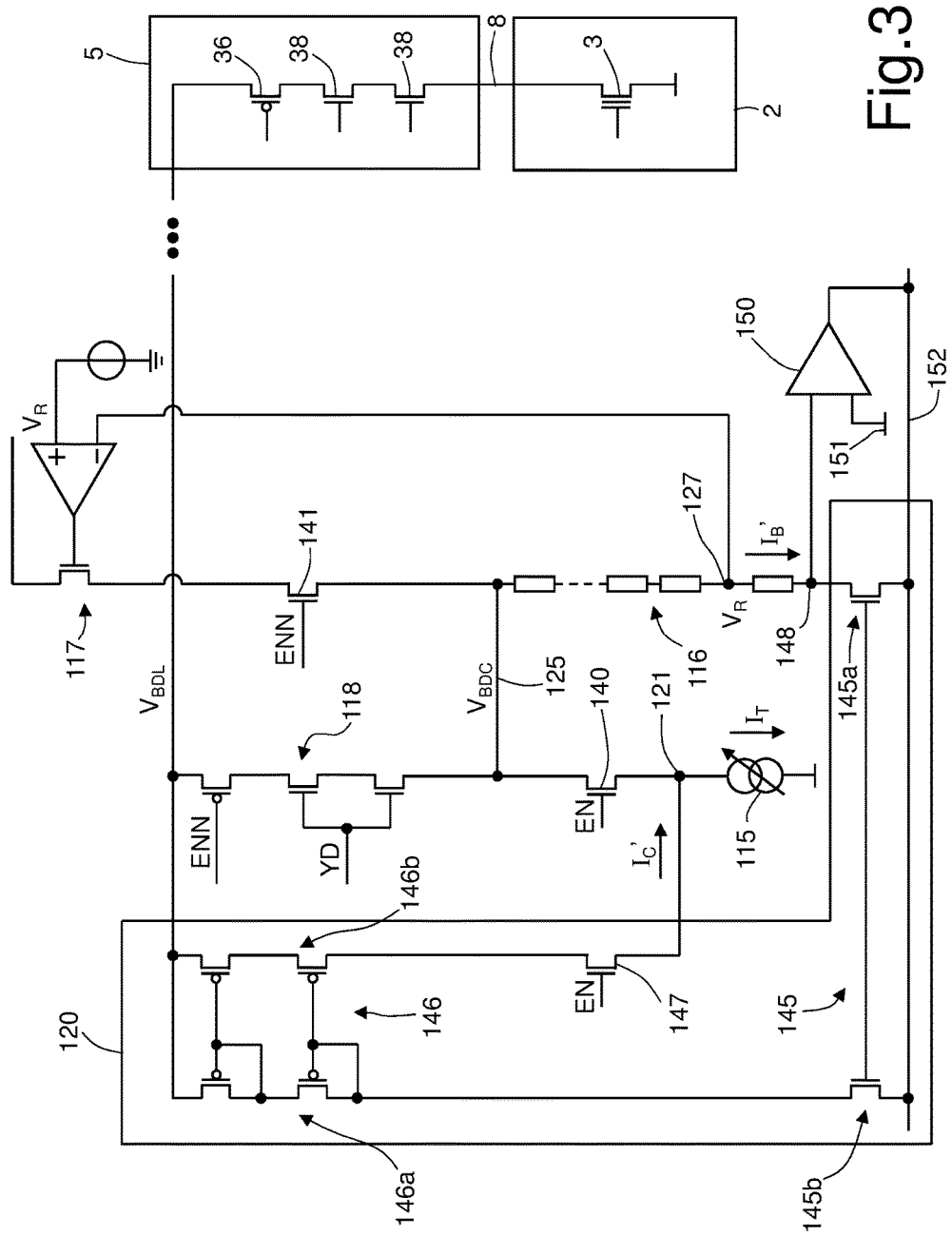
FIG. 3 is a simplified circuit diagram of a circuit for biasing non-volatile memory cells according to a different embodiment of the present invention.

FIG. 3 illustrates a different embodiment of the invention. In this case, a bias circuit 110 comprises a reference current generator 115, a bias resistive divider 116, a voltage regulator 117, and a dummy decoding path 118, which are substantially the same as the reference current generator 15, the bias resistive divider 16, and the voltage regulator 17 already described. In particular, the reference current generator 115 generates a reference current $I_T'$, which is picked up from a current adder node 121. The voltage regulator 117 is configured to impose a reference voltage on a bias regulation node 127 of the bias resistive divider 116 to obtain a bias current $I_B'$, and a cell bias voltage $V_{BDC}'$ on a cell bias node 125 to which the bias resistive divider 116 is coupled. The dummy decoding path 118 is connected between a global bias line 133 and the cell bias node 125, which is in turn connected to the current adder node 121 through an enable transistor 140.

The bias circuit 110 further comprises a compensation stage 120 configured to inject into the current adder node 121 a compensation current $I_C'$ equal to the bias current $I_B'$ that flows through the bias resistive divider 116. In detail, the compensation stage 120 comprises a sense current mirror 145 and a compensation current mirror 146, which is coupled to the current adder node 121 through an enable transistor 147.

The sense current mirror 145 has a sense branch 145a, coupled to the bias resistive divider 116 for receiving the bias current $I_B'$, and an output branch 145b. More precisely, the sense branch 145a of the sense current mirror 145 and the bias resistive divider 116 are coupled to a virtual ground node 148. To obtain the function of virtual ground, an operational amplifier 150 has an input coupled to a ground line 151, an input coupled to the virtual ground node 148, and an output coupled to a regulated negative line 152, which is used also as negative reference for the sense current mirror 145. The compensation current mirror 146 has a sense branch 146a coupled to the output branch 145a of the sense current mirror 145 and an output branch 146b, which is selectively connectable to the current adder node 121 for supplying the compensation current $I_C'$. On the hypothesis, which may readily be verified, that the sense current mirror 145 and the compensation current mirror 146 both have a unit mirror ratio, the compensation current $I_C'$ balances exactly the bias current $I_B'$ absorbed by the bias resistive divider 116. Consequently, the same reference current $I_T'$ that is supplied by the reference current generator 115 also flows through the dummy decoding path 118, the conditions of which are not affected by temperature variations.

Connection of the bias resistive divider 116 to the virtual ground node 148 enables the cell bias voltage $V_{BDC}'$ to be rendered substantially independent of the temperature and of the process spread.

Figure 4:
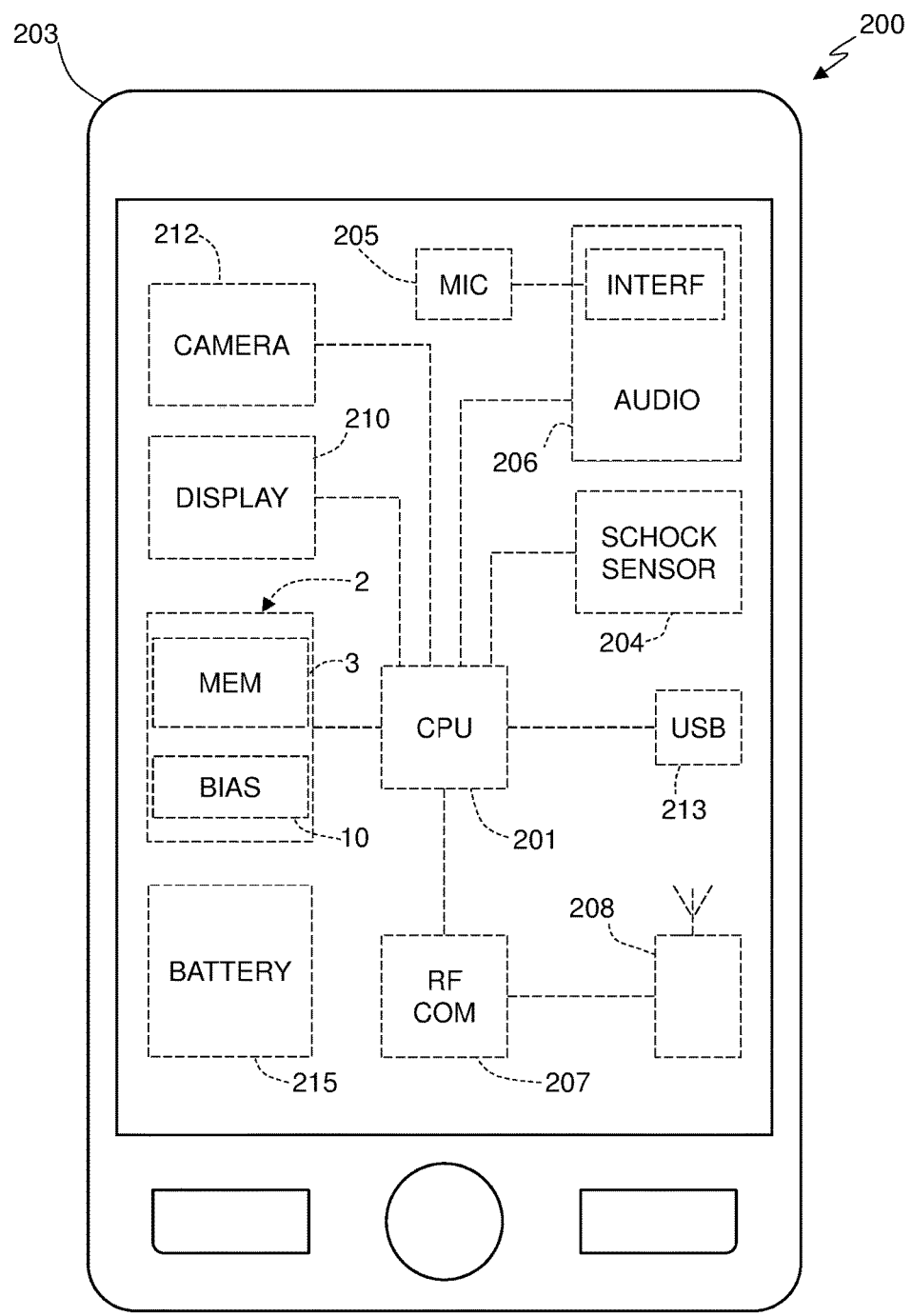
FIG. 4 is a simplified block diagram of an electronic system incorporating the non-volatile memory device of FIG. 1.

Illustrated in FIG. 4 is an electronic system 200, incorporating the non-volatile memory device 1 described with reference to FIGS. 1 and 2.

The electronic system 200 may be an electronic device of any type, in particular portable and supplied autonomously, such as, by way of non-limiting example, a cellphone, a portable computer, a video camera, a photographic camera, a multimedia reader, a portable apparatus for video games, a motion-activated user interface for computers or consoles for video games, a satellite navigation device, or a so-called "wearable" electronic device. In the embodiment of FIG. 4, the electronic system 200 is a cellphone.

The electronic system 200 may comprise a control unit 201 and the non-volatile memory device 2.

The electronic system 200 may further comprise a casing 203, rigidly coupled to which is an impact sensor 204, a microphone 205, for example a micro-electro-mechanical microphone coupled to an acquisition interface of an audio module 206, an RF communication module 207 coupled to an antenna 208, a display 210, a filming device 212, a serial connection port 213, for example a USB port, and a battery 215 for autonomous supply.

The non-volatile memory device 2 may contain code portions executable by the control unit 201. Furthermore, the control unit 201 may co-operate with the non-volatile memory device for recording, for example, images acquired through the filming device 212, audio files acquired by the microphone 205 or other files received through the RF communication module 207 or the serial connection port 213.

It can be noted that the scope of the present invention is not limited to embodiments necessarily having specifically one of the devices listed or all of them together.

Finally, it is evident that modifications and variations can be made to the circuit and to the method described herein, without thereby departing from the scope of the present invention, as defined in the annexed claims.

What is claimed is:

1. A bias circuit for biasing non-volatile memory cells, the bias circuit comprising:
    a dummy decoding path having a first terminal tied to a global bias line and a second terminal tied to a bias node, the dummy decoding path being configured to replicate a conductive path between a first terminal of a column decoder coupled to the non-volatile memory cells and a second terminal of the column decoder coupled to the bias circuit;
    a reference current generator, coupled to the dummy decoding path and configured to supply a reference current;
    a bias stage comprising a bias resistive divider path coupled between the bias node and a ground line, the bias stage configured to set a cell bias voltage on the bias node; and
    a compensation stage, configured to compensate a current absorption of the bias stage at the bias node so that the reference current will flow through the dummy decoding path.

2. The bias circuit according to claim 1, wherein the bias stage further comprises a bias voltage regulator configured to impose a reference voltage on a bias regulation node of the bias resistive path, and wherein the compensation stage is configured to supply a compensation current equal in magnitude to, and of opposite sign with respect, to a bias current flowing in the bias resistive path.

3. The bias circuit according to claim 2, wherein the compensation stage comprises a compensation generator circuit, configured to generate the compensation current, and a compensation current mirror, configured to couple the compensation current to the bias node.

4. The bias circuit according to claim 3, wherein the bias resistive path includes a bias resistive divider having a first divider portion between the bias regulation node and a ground line and a second divider portion between the bias node and the bias regulation node.

5. The bias circuit according to claim 4, wherein the compensation generator circuit comprises:
a resistive element coupled between a compensation regulation node and the ground line, the resistive element having an impedance equal to an impedance of the first divider portion; and
a compensation voltage regulator, configured to impose the reference voltage on the compensation regulation node.

6. The bias circuit according to claim 3, wherein the compensation generator circuit comprises a sense current mirror having a sense branch, coupled to the bias resistive path for receiving the bias current, and an output branch, coupled to a sense branch of the compensation current mirror.

7. The bias circuit according to claim 2, wherein the bias voltage regulator comprises an operational amplifier and a limiting transistor, the operational amplifier having a first terminal coupled to the bias regulation node, a second terminal coupled to a reference voltage generator and configured to supply the reference voltage, and an output coupled to a control terminal of the limiting transistor, wherein the limiting transistor has a conduction terminal connected to the global bias line.

8. A non-volatile memory device, comprising:
a plurality of non-volatile memory cells;
a program and read circuit that comprises a bias circuit according to claim 1; and
a column decoder and a row decoder, addressable for selecting sets of memory cells and coupling the sets of memory cells to the program and read circuit.

9. The memory device according to claim 8, wherein the global bias line is selectively connectable to drain terminals of the memory cells through the column decoder.

10. The memory device according to claim 8, wherein the column decoder has a number of decoding levels, and the dummy decoding path comprises a number of series-connected dummy decoding transistors that is equal to the number of decoding levels of the column decoder.

11. A non-volatile memory device, comprising:
a plurality of non-volatile memory cells arranged in rows and columns;
a column decoder having a first terminal coupled to the columns of memory cells;
a row decoder coupled to the rows of memory cells, the column decoder and row decoder addressable for selecting sets of memory;
a row bias circuit coupled to the row decoder; and
a column bias circuit coupled to a second terminal of the column decoder, the column bias circuit comprising a bias stage comprising a bias resistive divider path coupled between a bias node and a ground line, the column bias circuit further comprising a dummy decoding path having a first terminal coupled to form a node with a global bias line and a second terminal coupled to form a node with the bias node, the dummy decoding path being configured to replicate a conductive path between the first terminal and the second terminal of the column decoder, the column bias circuit configured to supply a reference current through the dummy decoding path to set a cell bias voltage on the bias node by the bias stage, wherein the reference current is supplied by compensating a current absorption of the bias stage at the bias node.

12. The memory device according to claim 11, wherein the column biased circuit comprises:

a reference current generator coupled to the dummy decoding path and configured to supply the reference current; and
a compensation stage, configured to compensate the current absorption of the bias stage at the bias node so that the reference current will flow through the dummy decoding path.

13. The memory device according to claim 11, wherein the global bias line is selectively connectable to drain terminals of the memory cells through the column decoder.

14. The memory device according to claim 11, wherein the column decoder has a number of decoding levels, and the dummy decoding path comprises a number of series-connected dummy decoding transistors that is equal to the number of decoding levels of the column decoder.

15. An electronic system comprising:
a control unit; and
a non-volatile memory device coupled to the control unit, the non-volatile memory device comprising a plurality of non-volatile memory cells, a program and read circuit that comprises a bias circuit, and a column decoder and a row decoder addressable for selecting sets of memory cells and coupling the sets of memory cells to the program and read circuit;
wherein the bias circuit comprises a dummy decoding path having a first terminal tied to a global bias line and a second terminal tied to a bias node, the dummy decoding path being configured to replicate a conductive path between a first terminal of a column decoder coupled to the non-volatile memory cells and a second terminal of the column decoder coupled to the bias circuit, a reference current generator coupled to the dummy decoding path and configured to supply a reference current, a bias stage comprising a bias resistive divider path coupled between the bias node and a ground line, the bias stage configured to set a cell bias voltage on the bias node, and a compensation stage configured to compensate a current absorption of the bias stage at the bias node so that the reference current will flow through the dummy decoding path.

16. The electronic system according to claim 15, wherein the electronic system comprises a mobile communication device, the electronic system further comprising:
a housing, wherein the control unit and the non-volatile memory device are located within the housing;
an impact sensor rigidly coupled to the housing;
a microphone located within the housing;
a camera located within the housing;
an RF communication module located within the housing;
an antenna located within the housing and coupled to the RF communication module; and
a display attached at an outer surface of the housing.

17. The electronic system according to claim 16, wherein the non-volatile memory device stores code portions executable by the control unit so that the control unit can manipulate images acquired by the camera, audio files acquired by the microphone, and information received through the RF communication module.

18. A method for biasing non-volatile memory cells, the method comprising:
supplying a reference current through a dummy decoding path having a first terminal coupled to form a node with a global bias line and a second terminal couple to form a node with a bias node, the dummy decoding path being configured to replicate a conductive path between a first terminal of a column decoder coupled to the non-volatile memory cells and a second terminal of the column decoder coupled to a bias circuit; and setting a cell bias voltage on the bias node by a bias stage comprising a bias resistive divider path coupled between the bias node and a ground line;

wherein supplying the reference current comprises compensating a current absorption of the bias stage at the bias node.

19. The method according to claim 18, wherein compensating comprises supplying a compensation current equal in magnitude to, and of opposite sign with respect, to a bias current picked up by the bias stage on the bias node.

20. The method according to claim 18, further comprising connecting the global bias line to a drain terminal of a non-volatile memory cell.

* * * * *